US007420250B2

(12) United States Patent
Lee et al.

(10) Patent No.: US 7,420,250 B2
(45) Date of Patent: Sep. 2, 2008

(54) ELECTROSTATIC DISCHARGE PROTECTION DEVICE HAVING LIGHT DOPED REGIONS

(75) Inventors: Shu-Chuan Lee, Hsin-Chu (CN);
Ming-Hsiang Song, Hsin-Chu (CN);
Shao-Chang Huang, Hsinchu (CN);
Yi-Hsun Wu, Hsin-Chu (CN);
Kuo-Feng Yu, Hsinchu (CN);
Jian-Hsing Lee, Hsin-Chu (CN);
Tong-Chern Ong, Chung-Ho (CN)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 117 days.

(21) Appl. No.: 11/212,000

(22) Filed: Aug. 25, 2005

(65) Prior Publication Data

US 2006/0043491 A1 Mar. 2, 2006

Related U.S. Application Data

(60) Provisional application No. 60/605,599, filed on Aug. 30, 2004.

(51) Int. Cl.
*H01L 23/62* (2006.01)
(52) U.S. Cl. ......................... 257/355; 257/371; 257/408
(58) Field of Classification Search ................. 257/110, 257/127, 141, 355–365, 371, 408
See application file for complete search history.

(56) References Cited

U.S. PATENT DOCUMENTS

| 5,371,396 | A | | 12/1994 | Vinal et al. | |
|---|---|---|---|---|---|
| 5,455,436 | A | * | 10/1995 | Cheng | .......................... 257/356 |
| 6,066,879 | A | | 5/2000 | Lee et al. | |
| 6,087,227 | A | * | 7/2000 | Hsu | ........................... 438/275 |
| 6,097,066 | A | * | 8/2000 | Lee et al. | ..................... 257/355 |
| 6,229,183 | B1 | * | 5/2001 | Lee | ............................ 257/360 |
| 6,320,237 | B1 | | 11/2001 | Assaderaghi et al. | |
| 6,329,287 | B1 | | 12/2001 | Gadepally | |
| 6,338,986 | B1 | * | 1/2002 | Kawazoe et al. | ............ 438/133 |
| 6,373,109 | B1 | * | 4/2002 | Ahn | ........................... 257/384 |
| 6,444,404 | B1 | * | 9/2002 | Chen et al. | ................... 430/314 |

(Continued)

OTHER PUBLICATIONS

Amerasekera, A., et al., "Substrate Triggering and Salicide Effects on ESD Performance and Protection Circuit Design in Deep Submicron CMOS Processes," pp. 21.3.1-21.3.4, 0-7803-2700-4, IEEE (1995).

(Continued)

*Primary Examiner*—David Vu
*Assistant Examiner*—Andres Lopez Esquerra
(74) *Attorney, Agent, or Firm*—Haynes Boone, LLP

(57) ABSTRACT

Provided are an electrostatic discharge (ESD) protection device and a method for making such a device. In one example, the ESD protection device includes a Zener diode region formed in a substrate and an N-type metal oxide semiconductor (NMOS) device formed adjacent to the Zener diode region. The Zener diode region has two doped regions, a gate with a grounded potential positioned between the two doped regions, and two light doped drain (LDD) features formed in the substrate. One of the LDD features is positioned between each of the two doped regions and the gate. The NMOS device includes a source and a drain formed in the substrate and a second gate positioned between the source and the drain.

19 Claims, 5 Drawing Sheets

U.S. PATENT DOCUMENTS

| | | |
|---|---|---|
| 6,475,838 B1 | 11/2002 | Bryant et al. |
| 6,542,346 B1 | 4/2003 | Chen et al. |
| 6,573,568 B2 * | 6/2003 | Lin et al. .................... 257/365 |
| 6,614,078 B2 | 9/2003 | Lee et al. |
| 6,628,493 B1 * | 9/2003 | Chen et al. ................. 361/111 |
| 6,670,245 B2 | 12/2003 | Yu |
| 6,700,771 B2 | 3/2004 | Bhattacharyya |
| 2002/0053704 A1 | 5/2002 | Avery et al. |
| 2002/0130366 A1 | 9/2002 | Morishita |
| 2003/0137789 A1 * | 7/2003 | Walker et al. ................. 361/56 |

OTHER PUBLICATIONS

Lozano, K., et al., "Alignment and Mechanical Characterization of Vapor Grown Carbon Nanofibers in Polyethylene", 8 pages.

Mergens, M., et al., "High Holding Current SCRs (HHI-SCR) for ESD Protection and Latch-Up Immune IC Operation", Saroff and ESD Association, 8 pages, EOS/ESD Symposium (paper 1A3) (2002).

Mohan, N., et al., "ESD Protection Design Methodology In Deep Sub-micron CMOS Technology", 47 pages, University of Waterloo, Waterloo, Ontario, Canada (Winter, 2003).

Paulson, S., et al., "Tunable Resistance of a Carbon Nanotube—Graphite Interface", pp. 1742-1744, vol. 290, (Dec. 1, 2000), www.sciencemag.org.

Verhaege, K., URL: http://www.eedesign.com/article/showArticle.jhtml?articleid=16503875;., ESD Process Shrinks I/Os Along Core Path, 4 pages, CMP Media LLC., Nov. 1, 2001, Issue #13149, p. 22 (Nov. 6, 2001).

Wei, B., et al., "Reliability and Current Carrying Capacity of Carbon Nanotubes", Applied Physics Letters, pp. 1172-1174, vol. 79, No. 8, American Institute of Physics, 0003-6951/2001/79(8)/1172/3 (Aug. 20, 2001).

* cited by examiner

ELECTROSTATIC DISCHARGE PROTECTION DEVICE HAVING LIGHT DOPED REGIONS

CROSS-REFERENCE

This patent claims the benefit of U.S. Provisional Application Ser. No. 60/605,599 filed Aug. 30, 2004, the disclosure of which is hereby incorporated by reference.

The present disclosure is related to the following commonly-assigned U.S. patent applications, the entire disclosures of which are hereby incorporated herein by reference:

U.S. patent application Ser. No. 10/694,129, entitled "DECOUPLING CAPACITOR," filed Oct. 27, 2003, having Jiaw-Ren Shih, Jian-Hsing Lee, and Shui-Hung Chen named as inventors;

U.S. patent application Ser. No. 10/687,314, entitled "ELECTROSTATIC DISCHARGE PROTECTION STRUCTURE FOR DEEP SUB-MICRON GATE OXIDE," filed Oct. 16, 2003, having Yi-Hsun Wu, Jian-Hsing Lee, and Tongchem Ong named as inventors; and U.S. patent application Ser. No. 10/950,844, entitled "ESD PROTECTION FOR HIGH VOLTAGE APPLICATIONS," filed Sep. 27, 2004, having Jian-Hsing Lee and Deng-Shun Chang named as inventors.

BACKGROUND

Many integrated circuits include electrostatic discharge (ESD) protection to prevent the damage that may be caused by ESD. ESD protection has become increasingly important as integrated circuit technologies have advanced in both integration density and integration complexity. However, conventional ESD protection devices may not work well in a die having multiple types of integrated devices. For example, when high voltage devices and low voltage devices are integrated in a same semiconductor die or wafer, an ESD protection circuit may need to be designed differently to protect both types of devices. However, an ESD protection circuit fabricated using an additional ESD implantation or without a silicide structure may lead to low yield and high cost in manufacturing and leakage concern in operation.

BRIEF DESCRIPTION OF THE DRAWINGS

Aspects of the present disclosure are best understood from the following detailed description when read with the accompanying figures. It is emphasized that, in accordance with the standard practice in the industry, various features may not be drawn to scale. In fact, the dimensions of the various features may be arbitrarily increased or reduced for clarity of discussion.

DETAILED DESCRIPTION

Figure 1:
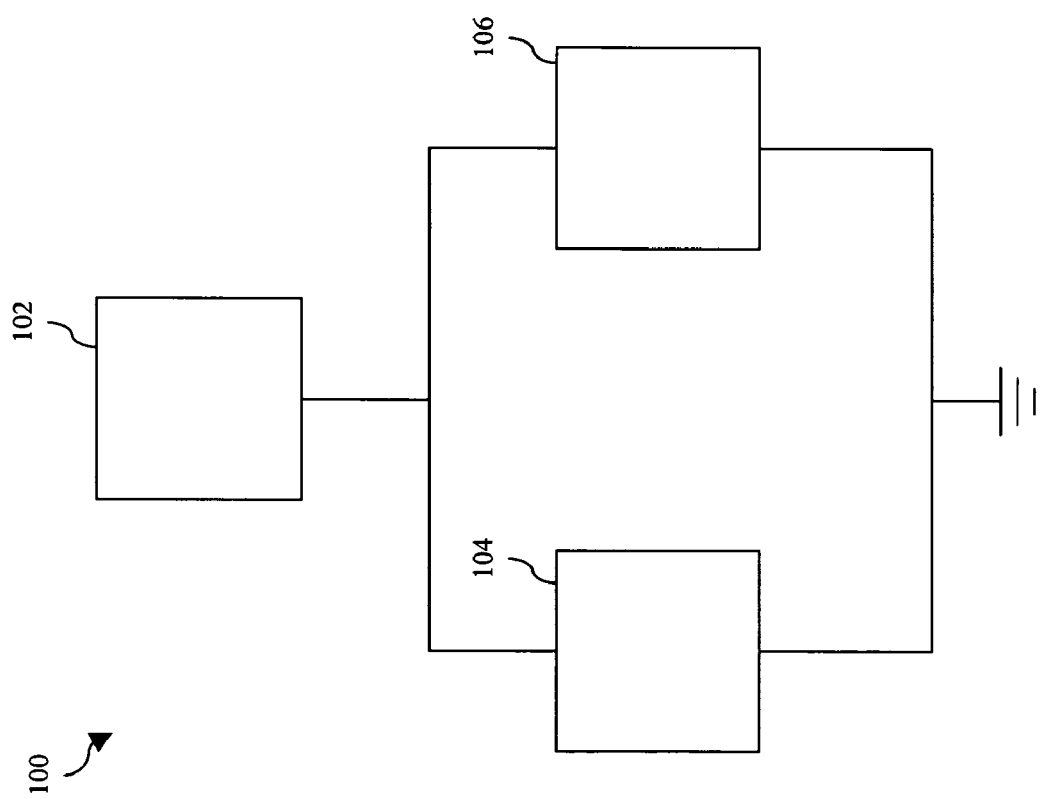
FIG. 1 is a schematic view of one embodiment of an integrated circuit device constructed according to aspects of the present disclosure.

It is to be understood that the following disclosure provides many different embodiments, or examples, for implementing different features of various embodiments. Specific examples of components and arrangements are described below to simplify the present disclosure. These are merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a schematic view of one embodiment of an integrated circuit (IC) device 100 constructed according to aspects of the present disclosure. The IC device 100 includes an electrical input device 102 and a microelectronic device 106 or other device which may require protection from electrostatic discharge (ESD) (an "ESD protected" device). The IC device 100 also includes an ESD protection device 104 electrically coupled in parallel with the I/O device 102 and the microelectronic device 106.

The I/O device 102 may be, comprise, or be coupled to a power supply or signal generator, or otherwise be configured to provide a power or data signal to the ESD protected device 106. The ESD protected device 106 may be or include one or more microelectronic devices, such as an n-type metal-oxide-semiconductor field effect transistor (NMOSFET or NMOS), a p-type metal-oxide-semiconductor field effect transistor (PMOSFET or PMOS), a complementary metal-oxide-semiconductor field effect transistor (CMOSFET or CMOS), a high voltage CMOS, an electrically programmable read only memory (EPROM) cell, an electrically erasable programmable read only memory (EEPROM) cell, a static random access memory (SRAM) cell, a dynamic random access memory (DRAM) cell, a single electron transistor (SET), a diode, a capacitor, an inductor, an integrated circuit (IC), other microelectronic devices, or arrays and/or combinations thereof.

The ESD protection device 104 is or includes a device adapted for the electrical protection of the ESD protected device 106 according to aspects of the present disclosure, and may include diodes, transistors, and/or a combination thereof. The ESD protection device 104 may be located within or proximate to the ESD protected device 106 or may be located remotely from the ESD protected device 106. Moreover, the arrangement of the ESD protection device 104 relative to the I/O device 102 and the ESD protected device 106 may vary from the illustrated embodiment within the scope of the present disclosure.

Figure 2:
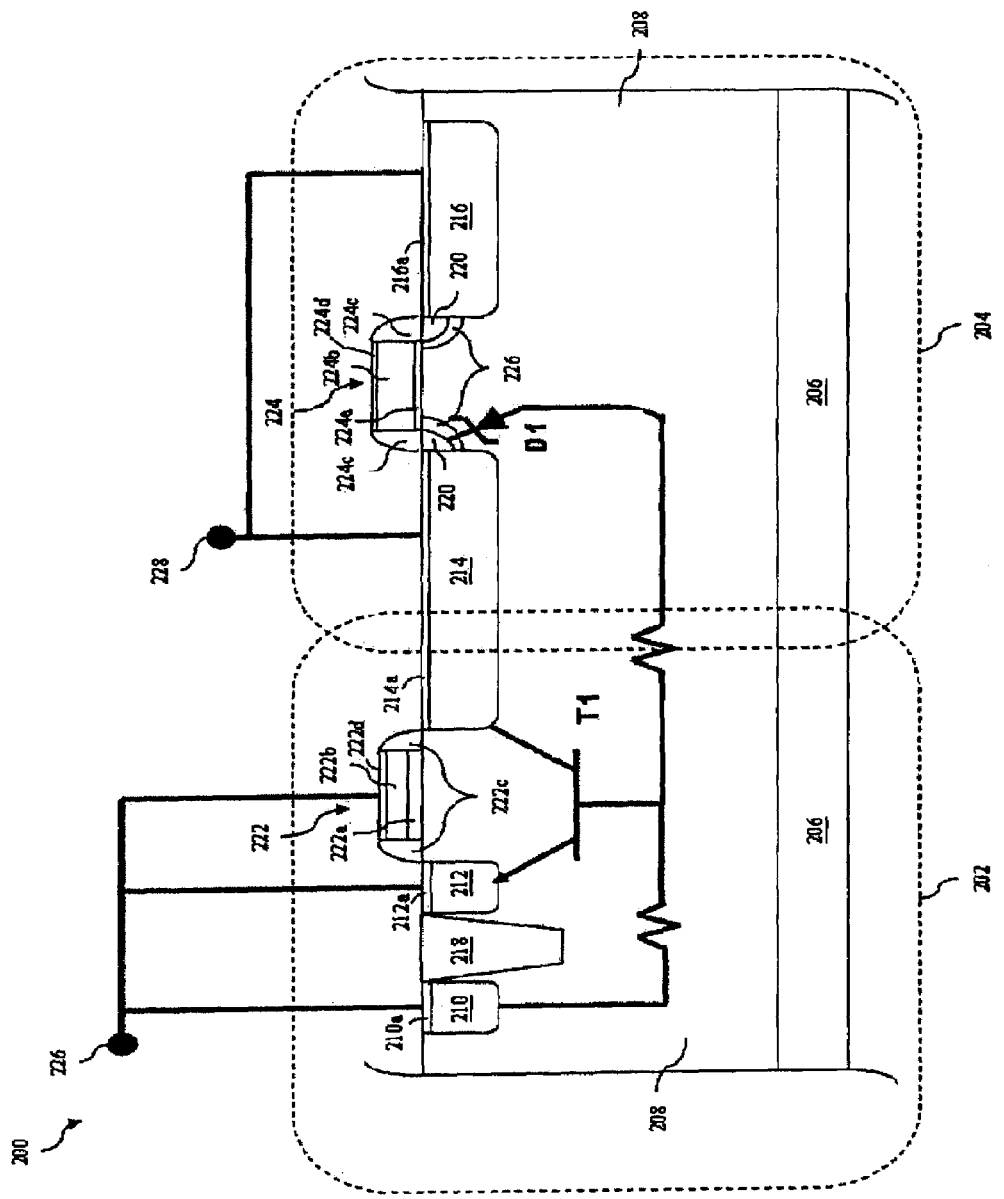
FIG. 2 is a sectional view of an exemplary embodiment of an electrostatic discharge (ESD) protection device.

Referring to FIG. 2, illustrated is a sectional view of one embodiment of an ESD protection device 200 representing one implementation of the ESD protection device 104 shown in FIG. 1. The ESD protection device 200 includes a substrate 206 having an NMOS transistor region 202 and a Zener diode region 204. The NMOS transistor region 202 and Zener diode region 204 are configured to form an ESD protection structure adapted for high voltage operation, low voltage operation, or dual power operation where both low voltage and high voltage devices are integrated together.

The ESD protection device 200 may further comprise a well structure such as a P-type well structure 208 formed in the substrate 206. The well 208 can be fabricated directly onto or within the substrate 206. In general, the substrate 206 may comprise N-well and/or P-well regions. N-well and/or P-well regions may have a retrograde doping profile. The well structure 208 is provided only as an example and is not meant to limit the disclosure in any manner.

The NMOS transistor region 202 includes doped regions 212 and 214 and a gate stack 222. The doped regions 212 and 214 may be heavy N (N+) doped regions laterally interposed by the gate stack 222. The doped regions 212 and 214 may comprise dopants such as Phosphorous (P), Arsenic (As), Antimony (Sb), or combinations thereof. For example, the doped regions 212 and 214 may have a doping concentration ranging from about $10^{15}$ to about $5 \times 10^{15}$ ion/$cm^2$. In one embodiment, there is no light doped drain (LDD) structure in the doped regions 212 and 214. The doped regions 212 and 214 may be formed by a suitable process such as ion implantation.

The gate stack 222 may include a gate dielectric 222a formed on the P doped well 208. The gate stack 222 also comprises a gate electrode 222b disposed over the gate dielectric 222a. The gate electrode 222b may comprise polycrystalline silicon (poly-Si), one or more metals such as Al, Cu, W, Ti, Ta, TiN, TaN, NiSi, CoSi, and/or other conductive material. The gate stack 222 may also include gate spacers 222c positioned on both sidewalls of the gate dielectric 222a and gate electrode 222b. The gate spacers 222c may comprise silicon nitride, silicon oxide, silicon carbide, silicon oxynitride, or combinations thereof. The gate spacers 222c may have a multilayer structure.

The transistor region 202 may further comprise a P-type doped region 210 formed in the P-well 208. The doped region 210 may have a P-type doping concentration ranging from about $10^{15}$ to about $5 \times 10^{15}$ ion/$cm^2$. The doped region 210 may be proximate to and laterally separated from the doped region 212 by an isolation feature 218. The doped region 210 may be extended in the well to encompass the NMOS transistor region 202 and the Zener diode region 204. The P doped region 210 may comprise dopants such as Boron (B), Gallium (Ga), Indium (In), or combinations thereof. The P doped region 210 may be formed by a suitable process including ion implantation. The isolation feature 218 may be formed using a variety of manufacturing technologies such as shallow trench isolation (STI) and local oxidation of silicon (LOCOS).

The gate electrode 222b and the doped region 212 may be routed to a grounded voltage source 226. Furthermore, the doped region 210 may also be routed to the voltage source 226 and grounded.

The Zener diode region 204 may include a portion of the doped region 214. The Zener diode region 204 may further comprise a heavy N (N+) doped region 216 formed in the P well 208, substantially similar in depth and/or N dopant concentration to the doped region 214. The Zener diode region 204 may comprise a gate stack 224 formed on the well 208 and laterally interposed between the doped regions 214 and 216. The gate stack may comprise a gate dielectric 224a disposed on the well 208 and a gate electrode 224b disposed on the gate dielectric 224a. The gate stack 224 may further comprise gate spacers 224c formed on both sidewalls of the gate dielectric 224a and gate electrode 224b. The gate dielectric 224a, gate electrode 224b, and gate spacers 224c may be substantially similar to the gate dielectric 222a, gate electrode 222b, and gate spacers 222c in terms of structure, material, and processing requirements. For example, the gate electrode 224b may comprise poly silicon and/or other conductive materials.

The Zener diode region 204 may comprise light doped drain (LDD, source and drain extension, or SDE) regions 220 formed in the well 208. The LDD regions 220 may be located laterally on both sides of the gate stack 224 and substantially underlying the spacers 224c. The LDD regions 220 may comprise N type doping such as P, As, N, and/or other suitable dopants. The LDD regions may have a lower doping concentration ranging from about $10^{13}$ to about $5 \times 10^{14}$ ion/$cm^2$. In another embodiment, the LDD regions 220 may have a doping concentration in the order of $10^{15}$ ion/$cm^2$. The LDD regions 220 may be formed by a suitable process such as ion implantation. In one example, the LDD regions 220 may be formed before forming the gate spacers 224c, while the doped regions 214 and 216 may be formed thereafter such that the doped regions 214 and 216 may be offset from the gate stack 224 by gate spacers 224c. In another embodiment, the LDD regions 220 may be formed using an angled implantation process or formed by a combination of both the angled implantation and an implantation prior to forming the gate spacers 224c. The Zener diode region 204 may further comprise halo (pocket implant) regions 226. The halo regions 226 may be located at both ends of a channel formed under the gate stack 224 and each halo region being disposed between one of the channel ends and one of the LDD regions. The halo doped regions 226 may comprise the same type of dopant as the dopant of the well 208 but with a heavier doping concentration. For example, the halo regions 226 may comprise P-type dopant such as boron, gallium, or indium. The halo regions 226 may be formed using angled ion implantation.

The gate electrode 224b may be biased to a floating potential. The doped regions 214 and 216 are routed to a voltage source 228, which may be an input/output (I/O) pad.

The gate stacks 222 and 224 may include silicide layers 222d and 224d, respectively, disposed thereon. The doped regions 210, 212, and 216 may include silicide layers 210a, 212a, and 216a, respectively, disposed thereon. Alternatively, the doped region 214 may also comprise a silicide layer 214a disposed thereon.

Figure 3:
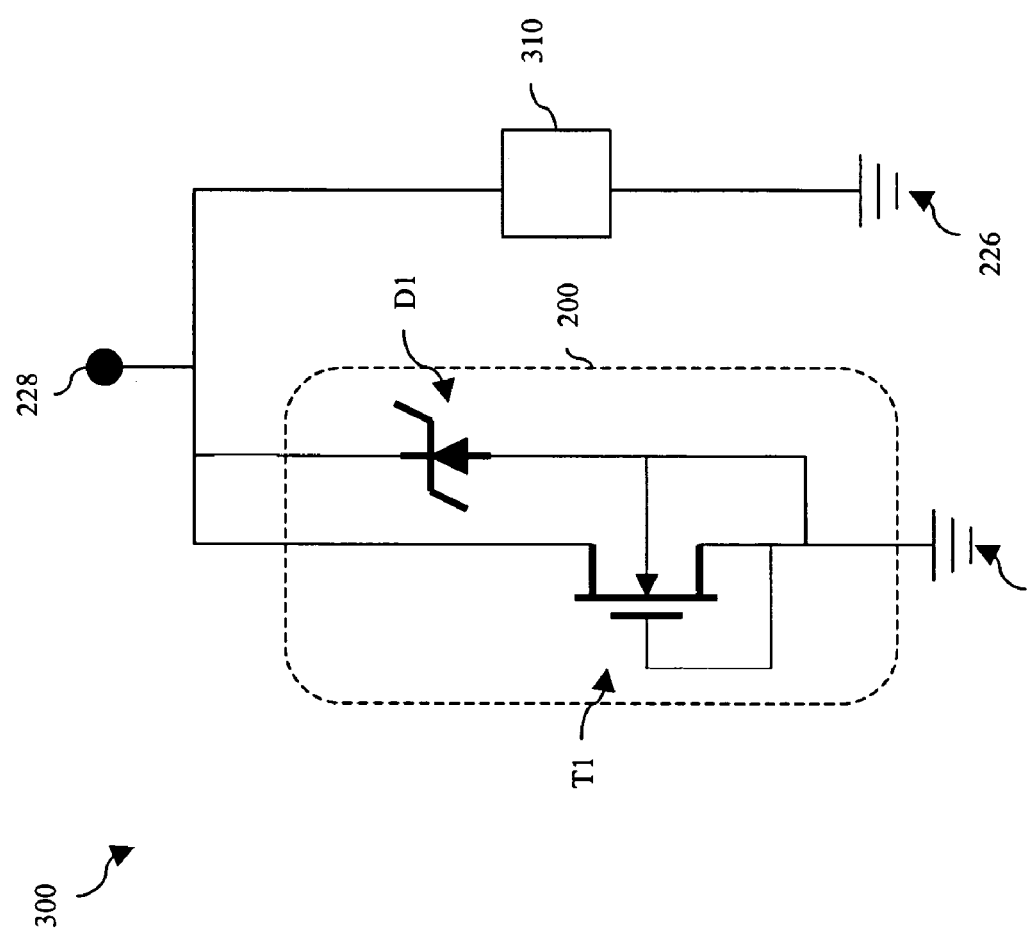
FIG. 3 is a schematic view of an exemplary embodiment of an ESD protection device.

With additional reference to a schematic view of an integrated circuit 300 in FIG. 3, an NPN bipolar transistor, referred to as T1, may be formed in the NMOS transistor region 202 by the N doped region 212 as a collector, the P well 208 as a base, and the N doped region 214 as an emitter. The base of the NPN bipolar transistor T1 is biased through the P doped region 210, which is grounded. The NPN bipolar transistor may be turned on to provide a discharge path from the I/O pad 228 to the ground 226 through the bulk semiconductor in the well 208 during an ESD event. A Zener diode, referred to as D1 in FIG. 1, may be formed in the Zener diode region 204 by the N doped region 214, the LDD region 220 next to the region 214, the halo region 226, and the P doped well 208. The LDD region 220 may cause the Zener diode D1 to have a low breakdown voltage and to be more easily turned on. The Zener diode D1 may be turned on to provide a discharge path from the I/O pad 228 to the ground 226 through the well 208 during an ESD event and further trigger on the NPN bipolar transistor T1 for a discharge so that ESD protected device 310, shown in FIG. 3, may be protected from ESD damage. The doped region 216 and LDD 220 next to the region 216, the halo region 226, and the P doped well 208 may form another Zener diode similar to the Zener diode D1 in structure and function and being in parallel therewith.

Figure 4:
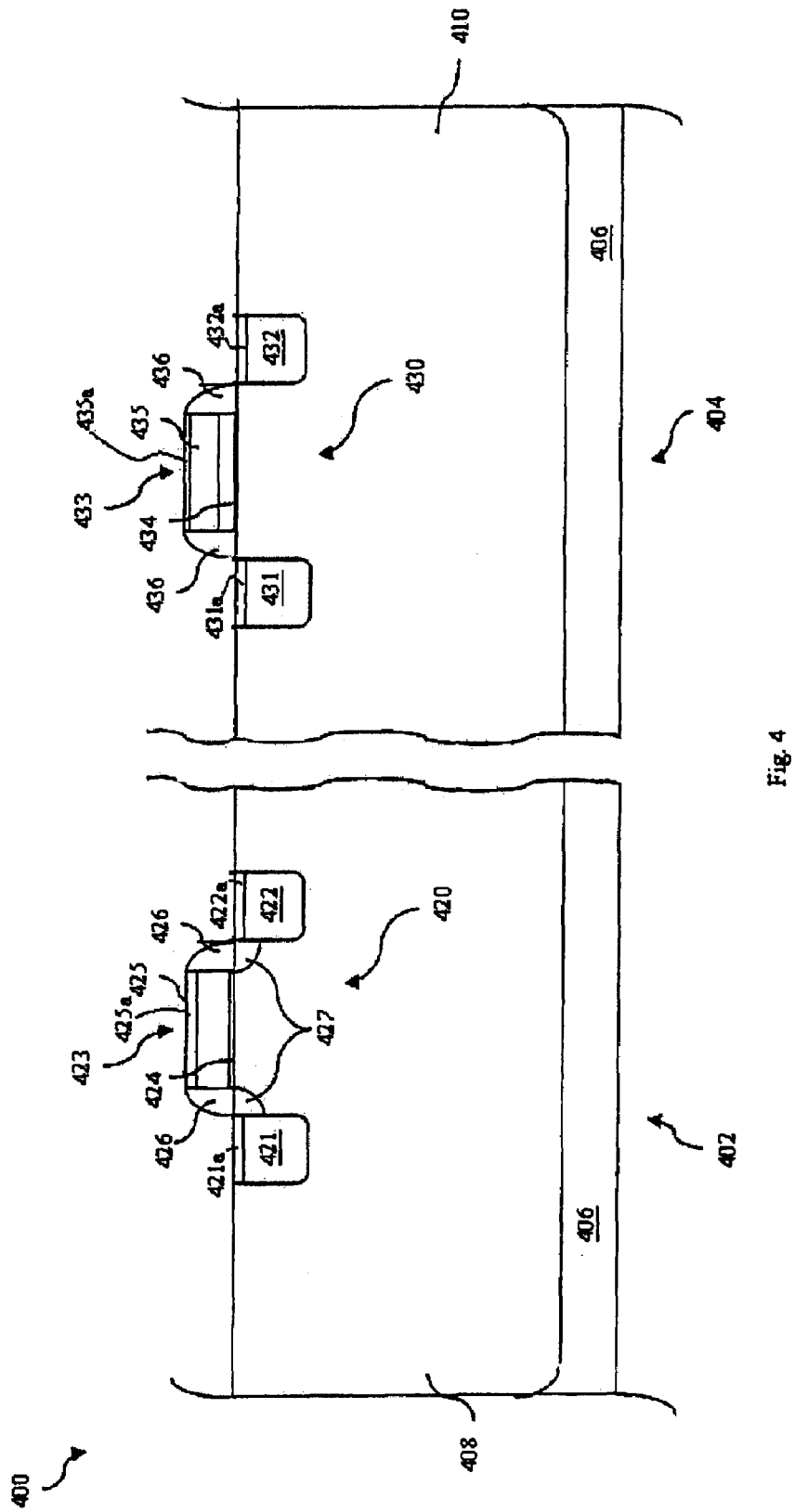
FIG. 4 is a sectional view of an exemplary embodiment of an ESD protection device.

Referring to FIG. 4, illustrated is an embodiment of an integrated circuit 400 having ESD protection constructed according to aspects of the present disclosure. The integrated circuit 400 may be formed on a substrate 406. The integrated circuit 400 may comprise a core device (ESD protected device) 404 and an ESD protection device 402. The ESD protection device 402 may comprise at least one metal oxide semiconductor (MOS) transistor such as an exemplary transistor 420. The transistor 420 may comprise doped regions 421 and 422 formed in a doped well 408 wherein the doped well has a first type of dopant and the doped regions 421 and 422 have a second type of dopant. For example, the first and second type dopants may be P type and N type dopants, respectively, or vice versa. The transistor 420 may further comprise LDD features 427 formed in the well 408. The LDD features 427 may comprise a doping concentration less than those of the doped regions 421 and 422 and have the second type of dopant. The LDD regions 427 may at least partially overlap the doped regions 421 and 422, and extend to under gate spacers 426, which will be described later. The transistor 420 may further comprise a gate stack 423 having a gate dielectric 424 disposed on the well 408 and a gate electrode 425 disposed on the gate dielectric 424. The gate stack 423 may further comprise the spacers 426 disposed on both sidewalls of the gate stack 423. The gate dielectric 424 may have a first thickness. For example, the first thickness may have a range between about 20 angstroms and about 200 angstroms. The doped regions 421 and 422 and the gate electrode 425 may further comprise silicide layers 421*a*, 422*a*, and 425*a*, respectively, to reduce contact resistance.

The ESD protected device 404 may comprise at least one metal oxide semiconductor (MOS) transistor such as an exemplary transistor 430. The transistor 430 may comprise doped regions 431 and 432 formed in a doped well 410 having the first (or the second) type of dopant, while the doped regions 431 and 432 have the second (or the first) type of dopant, accordingly. The doped regions 431 and 432 may comprise silicide layers 431*a* and 432*a*, respectively, disposed thereon. The transistor 430 may further comprise a gate stack 433 having a gate dielectric 434 disposed on the well 410 and a gate electrode 435 disposed on the gate dielectric 434. The gate electrode 435 may comprise a silicide layer 435*a* disposed thereon. The gate stack 433 may further comprise spacers 436 disposed on both sidewalls of the gate stack 433. The gate dielectric 434 may have a second thickness. For example, the second thickness may have a range between about 40 angstroms and about 400 angstroms. The second thickness is thicker than the first thickness. In one embodiment, the ESD protection device may comprise a plurality of NMOS transistors connected in parallel. The ESD protected device 404 may also comprise an exemplary MOS transistor having a gate dielectric of the second thickness.

In the disclosed structure of the integrated circuit 400, the ESD protected device 404 may comprise high voltage devices and low voltage devices each having a thick gate dielectric and a thin gate dielectric, respectively. The ESD protected devices may be protected by the ESD protection device 402, which may comprise at least one MOS transistor having a thin gate dielectric and may further have LDD features.

In another example, the ESD protection device that comprises at least one MOS transistor having a thin gate dielectric and having no LDD feature may be implemented to protect any proper devices formed in the same substrate. The protected devices may comprise a MOS transistor having a thick gate dielectric, a MOS transistor having a thin gate dielectric, a MOS transistor having LDD features, and other proper electronic devices.

Figure 5:
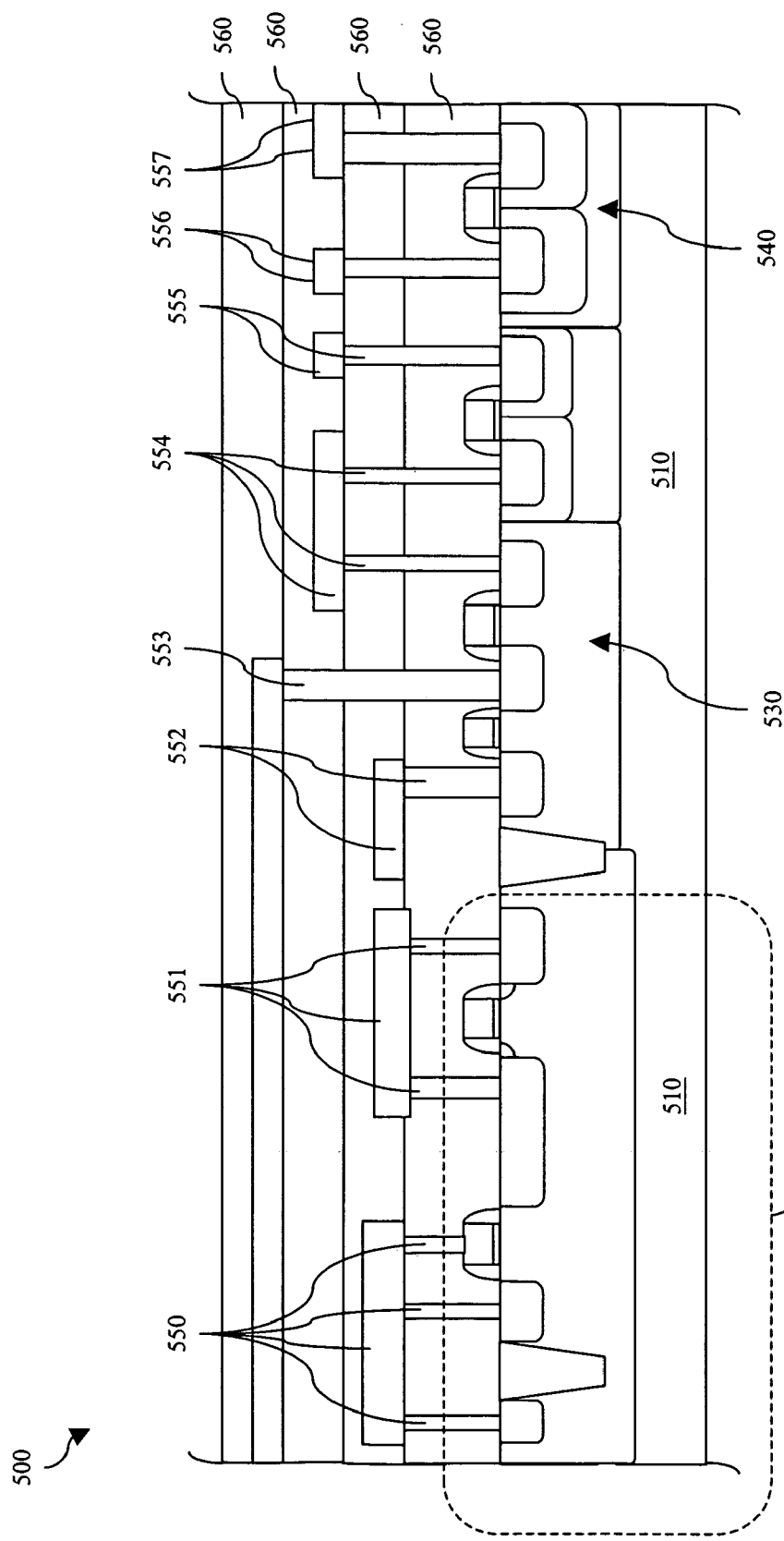
FIG. 5 is a sectional view of one embodiment of an integrated circuit device having an ESD protection device constructed according to aspects of the present disclosure.

Referring to FIG. 5, illustrated is a sectional view of an embodiment of an integrated circuit 500 constructed according to aspects of the present disclosure. The integrated circuit 500 includes a substrate 510. The integrated circuit 500 may include an ESD protection device 520 and a plurality of microelectronic devices 530 and 540 to be protected by the ESD protection device 520. The ESD protection device 520 may be or comprise one or more transistors, diodes, and/or other devices, and may be substantially similar to the ESD protection device 104 shown in FIG. 1. In one embodiment, the ESD protection device 520 may comprise the ESD protection device 200 of FIG. 2 and FIG. 3. The ESD protection device may comprise a P doped well and further comprise an NMOS region and a Zener diode region formed in the P doped well. The NMOS region, the Zener diode region, and the P doped well are substantially similar to the NMOS transistor region 202, the Zener diode region 204, and the well 208. The NMOS has an N doped source and an N doped drain wherein the drain is shared with the Zener diode region. The NMOS region may comprise a gate stack between the source and the drain. The NMOS region may further comprise a P doped region formed in the P well and the P doped region may be separated from the source by an isolation feature such as STI and LOCOS structures. The NMOS gate, the source, and the P doped region may be routed to a grounded source. The drain is routed to an I/O pad. The source, drain, and the P doped well form an NPN bipolar transistor to provide a discharge path from the I/O pad to the ground through the P doped well. The Zener diode region comprises a floating gate electrode and a LDD feature formed between the NMOS drain and the floating gate, in which the drain, LDD region, and the P doped well form a Zener diode to provide an ESD discharge path from the I/O pad to the ground through the P doped well. The Zener diode region may further comprise an additional LDD feature and an N doped region routed to the I/O pad, both of which are located on the other side of the floating gate and may form an additional Zener diode along with the P doped well to provide an additional ESD discharge path. The Zener diode(s) may trigger on the NPN bipolar transistor during ESD events to protect the core devices from ESD damage.

The ESD protected devices may include high voltage devices such as the device 540 and low voltage devices such as the device 530. The high voltage devices may comprise a double diffused drain (DDD) region, lateral double diffused MOS (LDMOS) structure, or vertical double diffused MOS (VDMOS). The high voltage devices may be formed by BiCMOS (stands for Bipolar-CMOS) process, or BCD technologies (stands for Bipolar-CMOS-DMOS). The high voltage devices may be formed in a well structure and have a junction depth less than about 60 nanometer.

The integrated circuit device 500 also includes a plurality of interconnects 550-557 extending along and/or through one or more insulating layers 560. The interconnects 550-557 may comprise copper, aluminum, tungsten, tantalum, titanium, nickel, cobalt, metal silicide, metal nitride, poly silicon, and/or other materials, possibly including one or more refractory layers or linings, and may be formed by CVD, PVD, ALD, plating, and/or other processes. The insulating layers 560 may comprise silicon dioxide, fluorinated silicon glass (FSG), SILK (a product of Dow Chemical of Michigan), BLACK DIAMOND (a product of Applied Materials of Santa Clara, Calif.), and/or other insulating materials, and may be formed by CVD, ALD, PVD, spin-on coating, and/or other processes.

The interconnects 550-557 may interconnect the ESD device 520 and one or more of the ESD protected microelectronic devices 530 and 540. Thus, for example, power supplied via some of the interconnects 552-557 may be directed to the microelectronic devices 530 and 540 unless the power spikes or surges to an excessive positive or negative potential, at which time all or a portion of the power may be directed to the ESD device 520. The interconnects 550 may ground one or more doped regions or contacts of the ESD device 520 and the interconnects 551 may route one or more doped regions to an I/O pad, such as are described above with respect to FIG. 2 and FIG. 3. The interconnects 553-557 may interconnect ones of the microelectronic devices 530, 540, and/or other devices integral to, proximate, or remote from those shown in FIG. 5.

Alternatively, in one embodiment, the ESD protection device 520 may comprise the ESD protection device 402 of FIG. 4 and the ESD protected devices 530 and 540 may comprise the ESD protected device 404 of FIG. 4. The ESD protected device may comprise devices having a thicker gate dielectric and having no LDD features, while the ESD protection devices may comprise devices having a thin gate dielectric and LDD features. The ESD protection device with a thin gate dielectric may protect other proper devices such as a core device having a thick gate dielectric.

In general, for above devices and structures, a substrate may be an elementary semiconductor such as silicon, germanium, and diamond. The substrate may also comprise a compound semiconductor such as silicon carbide, gallium arsenic, indium arsenide, and indium phosphide. The substrate may also comprise an alloy semiconductor such as silicon germanium, silicon germanium carbide, gallium arsenic phosphide, and gallium indium phosphide. The substrate may include an epitaxial layer over a bulk semiconductor. Furthermore, the substrate may be strained for performance enhancement. For example, the epitaxial layer may comprise semiconductor materials different from those of the bulk semiconductor such as a layer of silicon germanium overlying a bulk silicon, or a layer of silicon overlying a bulk silicon germanium formed by a process such as selective epitaxial growth (SEG). Furthermore, the substrate may comprise a semiconductor-on-insulator (SOI) structure. For example, the substrate may include a buried oxide (BOX) layer formed by a process such as separation by implanted oxygen (SIMOX).

A gate stack may include a gate dielectric. The gate dielectric may include silicon oxide, silicon oxynitride, or a high dielectric-constant (k) material such as hafnium oxide, hafnium silicide, zirconium oxide, aluminum oxide, silicon nitride, tantalum pentoxide, or combinations thereof. The gate dielectric may be formed by thermal oxide, atomic layer deposition (ALD), chemical vapor deposition (CVD), physical vapor deposition (PVD), or other suitable processing.

The gate stack also comprises a gate electrode disposed over a gate dielectric. The gate electrode may comprise polycrystalline silicon (poly-Si), metal such as Al, Cu, W, Ti, Ta, TiN, TaN, NiSi, CoSi, and/or other conductive material. The gate electrode may be formed by CVD, PVD, plating, ALD, and/or other suitable processes. The gate stack may further comprise a contact layer disposed over the gate electrode to reduce contact resistance and improve performance. The contact layer may comprise metal silicide such as nickel silicide, cobalt silicide, tungsten silicide, tantalum silicide, and titanium silicide. The contact layer may be formed by CVD, PVD, or ALD. In one example, silicide may be formed by a self-aligned silicidation process. The gate stack may also include gate spacers positioned on both sides of the gate dielectric and gate dielectric. The gate spacers may comprise silicon nitride, silicon oxide, silicon carbide, silicon oxynitride, or combinations thereof. The gate spacers may have multilayer structure and may be formed by depositing dielectric material and then anisotropically etching back.

An isolation feature may be formed using a variety of manufacturing technologies. For example, the isolation feature may comprise junction isolation, field isolation, dielectric isolation such as local oxidation of silicon (LOCOS) and shallow trench isolation (STI), or other suitable isolation structures. In one example, STI isolation structures may be formed by a process including etching a trench, forming dielectric material substantially filling the trench, and planarizing such that the STI is substantially coplanar with the doped regions using chemical mechanical planarization (CMP) or etch back processing.

In the present disclosure, various ESD protection devices having an NMOS transistor without LDD feature may be utilized in various design, configuration, and combination for efficient and robust ESD protection, and other advantages including enhanced ESD performance, reduced RC delay, and reduced manufacturing cost.

Thus, in one embodiment, the present disclosure provides an ESD protection device including a Zener diode region and an NMOS device. The Zener diode region is located in a substrate and includes a first doped region and a second doped region formed in the substrate. A first gate is disposed between the first doped region and the second doped region, the first gate having a floating potential. A first and a second LDD feature are formed in the substrate. The first LDD feature is disposed between the first doped region and the first gate and the second LDD feature is disposed between the second doped region and the first gate. The NMOS device is located in the substrate adjacent to the Zener diode region and includes a source and a drain formed in the substrate and a second gate disposed between the source and the drain.

In another embodiment, the present disclosure provides an ESD protection device formed in a P-type well in a substrate. The ESD protection device includes a Zener diode region located in the P-type well. The Zener diode region includes a first doped region and a second doped region formed in the substrate, both comprising N-type dopants and routed to an I/O pad. LDD regions are formed in the P-type well proximate to the first and second doped region, and a first gate is positioned between the first and second doped regions, the first gate having a floating potential. The ESD protection device also includes an NMOS device located in the P-type well adjacent the Zener diode region. The NMOS device includes a source of N-type dopants formed in the P-type well and grounded, a drain of N-type dopants formed from a portion of the first doped region in the P-type well, and a second gate positioned between the source and the drain, wherein the second gate is grounded.

In yet another embodiment, the present disclosure provides an ESD protection device formed in a P doped substrate. The ESD protection device includes a first gate located on the P doped substrate and having a floating potential. A first N+ doped region and a second N+ doped region are formed in the P doped substrate, interposed by the first gate, wherein the first and second N+ doped regions are routed to an I/O pad. A first and a second N doped region are disposed proximate to the first and second N+ doped regions, respectively, to form LDD features. A second gate is located on the P doped substrate next to the second N+ doped region and grounded. A third N+ doped region grounded is disposed such that the second and third N+ doped regions are interposed by the second gate. A P+ doped region is located in the P doped substrate and grounded.

In still another embodiment, an ESD protection device is provided. The ESD protection device includes a first N+ doped region formed in a P doped substrate and routed to an I/O pad. A first N doped region is disposed proximate to the first N+ doped region, wherein the first N+ doped region, the first N doped region, and the P doped substrate form a Zener diode. A gate is located on the P doped substrate, wherein the gate is disposed next to the first N+ doped region and grounded. A second N+ doped region that is grounded is disposed such that the first and second N+ doped regions are interposed by the gate, wherein the first, second N+ doped regions, and the P doped substrate form an NPN bipolar transistor. A P+ doped region is formed in the N doped substrate, wherein the P+ doped region is located proximate to the second N+ doped region and grounded.

In another embodiment, the present disclosure provides for an integrated circuit having an ESD protection device formed in a substrate. The integrated circuit includes a Zener diode located in a P-type well. The Zener diode has first and second doped regions formed in the substrate, wherein the first and second doped regions comprise N-type dopants and are routed to an I/O pad. LDD regions are formed in the P-type well, and a first gate having a floating potential is disposed between the first and second doped regions. The integrated circuit also includes an NMOS device located in the P-type well adjacent the Zener diode. The NMOS device has a grounded source of N-type dopants formed in the P-type well. A drain of N-type dopants is formed from a portion of the first doped region in the P-type well, and a second gate is disposed between the source and the drain and grounded. The integrated circuit also includes at least one high voltage ESD protected device formed in the substrate, and at least one low voltage ESD protected device formed in the substrate.

In yet another embodiment, the present disclosure provides a method for forming an ESD protection device in a P doped substrate. The method includes forming first and second N doped regions in the P doped substrate. A first gate having a floating potential is formed on the P doped substrate between the first and second N doped regions. First and second N+ doped regions are formed in the P doped substrate, wherein the first and second N+ doped regions are proximate to the first and second N doped regions. A second gate is formed on the P doped substrate next to the second N+ doped region. A third N+ doped region separated from the second N+ doped region by the second gate is formed, wherein the third N+ doped region is grounded. A P+ doped region located in the P doped substrate is formed.

In still another embodiment, the present disclosure provides an integrated circuit having ESD protection. The integrated circuit includes an ESD protection device formed in a substrate and having a first gate dielectric of a first thickness. The integrated circuit also includes an ESD protected device formed in the substrate and having a second gate dielectric of a second thickness that is higher than the first thickness, wherein the ESD protected device does not contain a LDD structure.

In another embodiment, the present disclosure provides an integrated circuit having electrostatic discharge (ESD) protection. The integrated circuit comprises an ESD protection device formed in the substrate, having a first gate dielectric of a first thickness, having no light doped drain (LDD) structure, and being configured to protect other devices formed in the substrate, wherein at least one of the other devices has a second gate dielectric of a second thickness thicker than the first thickness.

In another embodiment, an integrated circuit having ESD protection is disclosed. The integrated circuit includes an ESD protection device and an ESD protected device. The ESD protection device includes at least one MOS device, comprising first and second light doped regions of a first dopant type formed in a substrate. The ESD protection device further includes a first gate electrode positioned between the first and second light doped regions and separated from the substrate by a first gate dielectric of a first thickness. First and second heavy doped regions are disposed proximate to the first and second light doped regions. The ESD protected device includes at least one MOS transistor, comprising third and fourth heavy doped regions of a second dopant type formed in the substrate. The ESD protected device further includes a second gate electrode positioned between the third and fourth heavy doped regions, wherein the second gate electrode is separated from the substrate by a second gate dielectric of a second thickness that is higher than the first thickness.

In another embodiment, the present disclosure provides an ESD protection device. The integrated circuit comprises first and second light doped regions of a first dopant type formed in a substrate, a first gate electrode positioned between the first and second light doped regions and separated from the substrate by a first gate dielectric of a first thickness, and first and second heavy doped regions disposed proximate to the first and second light doped regions, wherein the ESD protected device is configured to protect other devices formed in the substrate, and at least one of the other devices has a second gate dielectric of a second thickness thicker than the first thickness.

In yet another embodiment, a method for forming an integrated circuit with ESD protection is disclosed. The method includes forming an ESD protection device having a first gate dielectric of a first thickness in a substrate, and forming an ESD protected device having a second gate dielectric of a second thickness that is higher than the first thickness in the substrate, wherein the ESD protection device has no LDD structure.

The foregoing has outlined features of several embodiments according to aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An electrostatic discharge (ESD) protection device, comprising:
 a Zener diode region located in a substrate, comprising:
  a first doped region and a second doped region formed in the substrate, wherein the first doped region and the second doped region are physically connected to a common I/O pad;
  a first gate disposed between the first doped region and the second doped region, the first gate having a floating potential; and
  a first and a second light doped drain (LDD) feature formed in the substrate, wherein the first LDD feature is disposed between the first doped region and the first gate and the second LDD feature is disposed between the second doped region and the first gate; and
 an N-type metal oxide semiconductor (NMOS) device located in the substrate adjacent to the Zener diode region, wherein the Zener diode region and the NMOS device are adapted to protect at least one core device, and wherein the NMOS device comprises:

a source and a drain formed in the substrate, wherein one of the source and the drain is coupled to a first voltage source and the other of the source and the drain is coupled to the pad; and a second gate disposed between the source and the drain, wherein the second gate is coupled to the first voltage source.

2. The device of claim 1, wherein the source and the gate in the NMOS device are grounded.

3. The device of claim 1, wherein the drain in the NMOS device is routed to the I/O pad.

4. The device of claim 1, wherein the drain in the NMOS device and the first doped region in the Zener diode region are formed from a single doped region.

5. The device of claim 1, wherein there is no LDD feature in the NMOS device.

6. The device of claim 1, wherein the NMOS and the Zener diode region are formed in a P-type well in the substrate.

7. The device of claim 6, wherein the P-type well further comprises a P-typed doped region.

8. The device of claim 7, wherein the P-type doped region is grounded.

9. The device of claim 7, wherein the P-type doped region is configured to encompass both the NMOS device and the Zener diode region.

10. The device of claim 7, wherein the P-type doped region is separated from the NMOS and the Zener diode region by an isolation feature formed in the substrate.

11. The device of claim 1, wherein the first and second doped regions comprise N-type dopants.

12. The device of claim 1, wherein the first and second LDD features comprise N-type dopants.

13. An integrated circuit comprising:
an electrostatic discharge (ESD) protection device and a plurality of core devices, the ESD protection device formed in a substrate, having a first gate dielectric of a first thickness, having a first doped region and a second doped region, having light doped drain (LDD) structures, and being configured to protect the core devices formed in the substrate, wherein at least one of the core devices has a second gate dielectric of a second thickness thicker than the first thickness, and wherein the first doped region and the second doped region are physically connected to a common signal pad.

14. The integrated circuit of claim 13, wherein the core devices comprise at least one device having a third gate dielectric of the first thickness.

15. The integrated circuit of claim 13 wherein the core devices comprise a plurality of metal oxide semiconductor (MOS) transistors without LDD structures.

16. The integrated circuit of claim 13 wherein the core devices comprise a silicide layer configured for contact.

17. An integrated circuit having electrostatic discharge (ESD) protection comprising:
an ESD protection device including at least one metal oxide semiconductor (MOS) device, comprising:
first and second light doped regions of a first dopant type formed in a substrate;
a first gate electrode positioned between the first and second light doped regions and separated from the substrate by a first gate dielectric of a first thickness; and
first and second heavy doped regions disposed proximate to the first and second light doped regions, wherein the first and second heavy doped regions are physically connected to a common pad; and
an ESD protected device including at least one MOS transistor, comprising:
third and fourth heavy doped regions of a second dopant type formed in the substrate; and
a second gate electrode positioned between the third and fourth heavy doped regions, wherein the second gate electrode is separated from the substrate by a second gate dielectric of a second thickness that is thicker than the first thickness.

18. The integrated circuit of claim 17, wherein the first and second dopant types each comprises one of the N-type dopants and the P-type dopants.

19. The integrated circuit of claim 17, wherein
the first light doped region includes an N doped region formed in a P doped substrate;
the first heavy doped region includes an N+ doped region disposed proximate to the N doped region; and
the N+ doped region, the N doped region, and the P doped substrate form a Zener diode.

* * * * *